(12) United States Patent
Zhang et al.

(10) Patent No.: US 9,768,161 B2
(45) Date of Patent: Sep. 19, 2017

(54) FINFET CAPACITOR CIRCUIT

(71) Applicant: QUALCOMM Incorporated, San Diego, CA (US)

(72) Inventors: Rongtian Zhang, San Diego, CA (US); Lew Chua-Eoan, Carlsbad, CA (US); Shiqun Gu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/856,873

(22) Filed: Sep. 17, 2015

(65) Prior Publication Data

US 2016/0013180 A1    Jan. 14, 2016

Related U.S. Application Data

(62) Division of application No. 13/602,714, filed on Sep. 4, 2012, now Pat. No. 9,142,548.

(51) Int. Cl.

| | | |
|---|---|---|
| H01L 27/06 | (2006.01) | |
| H01L 29/66 | (2006.01) | |
| H01L 21/84 | (2006.01) | |
| H01L 27/12 | (2006.01) | |
| H01L 27/13 | (2006.01) | |
| H01L 49/02 | (2006.01) | |
| H01L 27/088 | (2006.01) | |
| H01L 21/8234 | (2006.01) | |

(52) U.S. Cl.
CPC ........ H01L 27/0629 (2013.01); H01L 21/845 (2013.01); H01L 27/0886 (2013.01); H01L 27/1211 (2013.01); H01L 27/13 (2013.01); H01L 28/86 (2013.01); H01L 29/66795 (2013.01); H01L 21/823431 (2013.01)

(58) Field of Classification Search
None
See application file for complete search history.

(56) References Cited

U.S. PATENT DOCUMENTS

| | | | |
|---|---|---|---|
| 6,094,335 | A | 7/2000 | Early |
| 7,060,553 | B2 | 6/2006 | Fried et al. |
| 7,696,040 | B2 | 4/2010 | Zhu |
| 8,519,481 | B2 | 8/2013 | Yuan et al. |
| 8,679,960 | B2 * | 3/2014 | Papasouliotis ........ H01J 37/321 257/E21.211 |
| 2004/0262698 | A1 | 12/2004 | Nowak |
| 2006/0054978 | A1 | 3/2006 | Clark, Jr. et al. |

(Continued)

FOREIGN PATENT DOCUMENTS

| | | |
|---|---|---|
| CA | 2806689 A1 | 2/2012 |
| CN | 1770471 A | 5/2006 |
| CN | 101661932 A | 3/2010 |

OTHER PUBLICATIONS

International Search Report and Written Opinion—PCT/US2013/058066—ISA/EPO—Feb. 25, 2014.

*Primary Examiner* — Bilkis Jahan
(74) *Attorney, Agent, or Firm* — Qualcomm Incorporated

(57) ABSTRACT

A capacitor includes a semiconductor substrate. The capacitor also includes a first terminal having a fin disposed on a surface of the semiconductor substrate. The capacitor further includes a dielectric layer disposed onto the fin. The capacitor still further includes a second terminal having a FinFET compatible high-K metal gate disposed proximate and adjacent to the fin.

23 Claims, 9 Drawing Sheets

(56) References Cited

U.S. PATENT DOCUMENTS

| | | |
|---|---|---|
| 2006/0231881 A1 | 10/2006 | Clark, Jr. et al. |
| 2007/0117311 A1 | 5/2007 | Zaman |
| 2007/0200161 A1 | 8/2007 | Nowak |
| 2008/0029821 A1 | 2/2008 | Yamagami et al. |
| 2008/0173913 A1* | 7/2008 | Kojima ............... H01L 27/1203 257/296 |
| 2010/0025767 A1* | 2/2010 | Inaba ................ H01L 29/41791 257/365 |
| 2011/0291166 A1* | 12/2011 | Booth, Jr. ......... H01L 21/82382 257/296 |
| 2011/0298025 A1 | 12/2011 | Haensch et al. |
| 2012/0032302 A1 | 2/2012 | Smith |
| 2012/0196425 A1* | 8/2012 | Scheiper ........... H01L 29/66545 438/400 |
| 2013/0113072 A1 | 5/2013 | Liu et al. |
| 2013/0270620 A1 | 10/2013 | Hu et al. |
| 2014/0061744 A1 | 3/2014 | Zhang et al. |

\* cited by examiner

FINFET CAPACITOR CIRCUIT

CROSS-REFERENCE TO RELATED APPLICATION

This application is a divisional of U.S. patent application Ser. No. 13/602,714, entitled "FinFET CIRCUIT," filed on Sep. 4, 2012, the disclosure of which is expressly incorporated herein by reference in its entirety.

TECHNICAL FIELD

The present disclosure relates generally to fin-type passive components. More specifically, the disclosure relates to capacitors compatible with FinFET process technology.

BACKGROUND

In mobile communication and mobile computing systems, the combined need for digital and non-digital functionalities in an integrated system is driving a dual trend in system level integration.

One trend in system level integration is the concept of a system on chip (SOC). In a system on chip, functions (e.g., digital functions) are integrated on-chip. In these systems, the number of digital functions that may be integrated on-chip continues to increase as the number of transistors available on-chip increases. Another trend in system level integration is the functional diversification of semiconductor-based devices. Instead of implementing devices on one chip, the devices are implemented on multiple chips and integrated into one package, referred to as a system in package (SiP).

In a system on chip as well as a system in package, the embedded capacitors for providing the digital functions are built with metal layers. Furthermore, in a typical system, the conventional capacitors are not proximate to the active devices. This leads to larger area consumption and a more parasitic relationship. Conventional capacitor process technologies are also associated with a two-dimensional (2D) process. A FinFET process technology is associated with a three-dimensional (3D) process.

SUMMARY

In accordance with an aspect of the present disclosure a capacitor is presented. The capacitor includes a semiconductor substrate. The capacitor also includes a first terminal having a fin disposed on a surface of the semiconductor substrate. The capacitor further includes a dielectric layer disposed onto the fin. The capacitor still further includes a second terminal having a FinFET compatible high-K metal gate disposed proximate and adjacent to the fin.

In accordance with another aspect of the present disclosure, a capacitor includes a semiconductor substrate. The capacitor also includes a first terminal comprising a first set of gates disposed on a surface of the semiconductor substrate. The capacitor further includes a second terminal comprising a second set of gates disposed on the surface of the semiconductor substrate. The capacitor still further includes fins disposed on the surface of the semiconductor substrate, between the first and second set of gates. The fins may be coated with a dielectric film.

In accordance with yet another aspect, a capacitor includes a semiconductor substrate. The capacitor also includes a first terminal having a first set of fins disposed on a surface of the semiconductor substrate. The capacitor further includes a second terminal having a second set of fins disposed on the surface of the semiconductor substrate. The capacitor still further includes a dielectric layer disposed between the first and second set of fins.

In accordance with still yet another aspect, a method of manufacturing a FinFET capacitor is presented. The method includes fabricating a first terminal comprising a fin on a surface of a semiconductor substrate. The method also includes depositing a dielectric layer on the fin. The method further includes depositing a FinFET compatible high-K metal gate proximate and adjacent to the fin.

In accordance with another aspect, a method of manufacturing a FinFET capacitor is presented. The method includes fabricating a first terminal having a first set of gates disposed on a surface of a semiconductor substrate. The method also includes fabricating a second terminal having a second set of gates disposed on the surface of the semiconductor substrate. The method further includes fabricating fins disposed on the surface of the semiconductor substrate, between the first and second sets of gates. The method also includes coating the fins with a dielectric film.

In accordance with yet another aspect, a method of manufacturing a FinFET capacitor is presented. The method includes fabricating a first terminal comprising a first set of fins disposed on a surface of a semiconductor substrate. The method also includes fabricating a second terminal comprising a second set of fins disposed on the surface of the semiconductor substrate. The method also includes fabricating a dielectric layer disposed between the first and second sets of fins.

In accordance with still yet another aspect, a capacitor is presented. The capacitor includes means for supporting at least one fin. The capacitor also includes a terminal disposed on a surface of the supporting means. The terminal may include the fin(s). The capacitor further includes means for insulating disposed onto the terminal. The capacitor also has a conductive gate disposed proximate and adjacent to the terminal.

In accordance with still another aspect, a capacitor is presented. The capacitor includes means for supporting fins. The capacitor also includes a first terminal comprising fins disposed on a surface of the supporting means. The capacitor further includes a second terminal that may also include fins disposed on the surface of the supporting means. The capacitor also has means for insulating disposed between the first and second sets of fins.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

The features, nature, and advantages of the present disclosure will become more apparent from the detailed description set forth below when taken in conjunction with the drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts.

One aspect of the disclosure involves a fin-type passive component, such as a capacitor that is compatible with FinFET process technology. Furthermore, one aspect of the present disclosure provides a FinFET capacitor having a substantially higher dielectric constant (K) than the dielectric constant of a metal-insulator-metal (MiM) or a metal-oxide-metal (MoM) capacitor. The higher dielectric constant may be due to the high-K metal gate process as compared to the lower K interconnect technology. Additionally, one configuration of a FinFET capacitor exhibits a small distance between an anode and a cathode. In particular, the spacing between an anode and a cathode, in this configuration, is limited by a spacer thickness. Moreover, a FinFET capacitor of one aspect of the present disclosure may be placed in close proximity to active devices and is scalable. That is, the thin height of a fin-type passive component may be scaled up and the 2D geometries may be scaled down to increase a capacitance value of a FinFET capacitor according to one aspect of the present disclosure. The noted aspects of the FinFET passive components, such as a FinFET capacitor, are compatible with a FinFET process flow, for example, as illustrated in FIG. 1.

Figure 1:
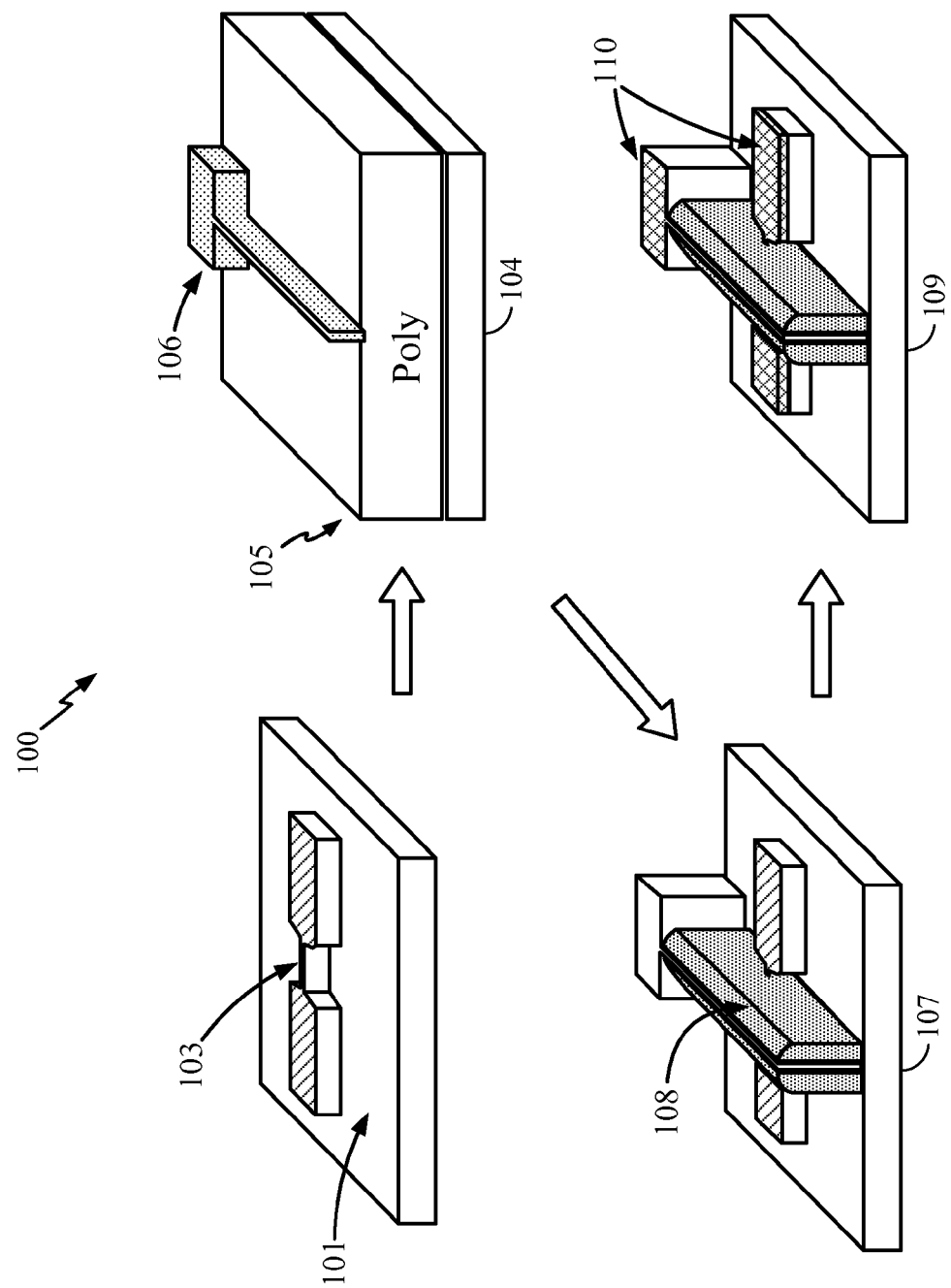
FIG. 1 illustrates a FinFET process flow according to an aspect of the present disclosure.

FIG. 1 illustrates an example of a FinFET process flow 100. The process flow begins with silicon on insulator (SOI) substrate 101. A semiconductor (e.g., silicon (Si)) fin 103 is patterned on the SOI substrate 101. After the semiconductor fin 103 is patterned, the process performs polysilicon gate deposition/lithography 104 to deposit polysilicon 105 and a resistor 106 on the SOI substrate 101. Next, the process performs a gate etch and spacer formation 107 to etch the gate and create a silicon nitride ($Si_3N_4$) spacer 108. Finally, the process performs a source/drain implant and rapid thermal anneal silicidation 109 so that a silicide, for example, a nickel silicide (NiSi) 110 is deposited on various surfaces.

Figure 2:
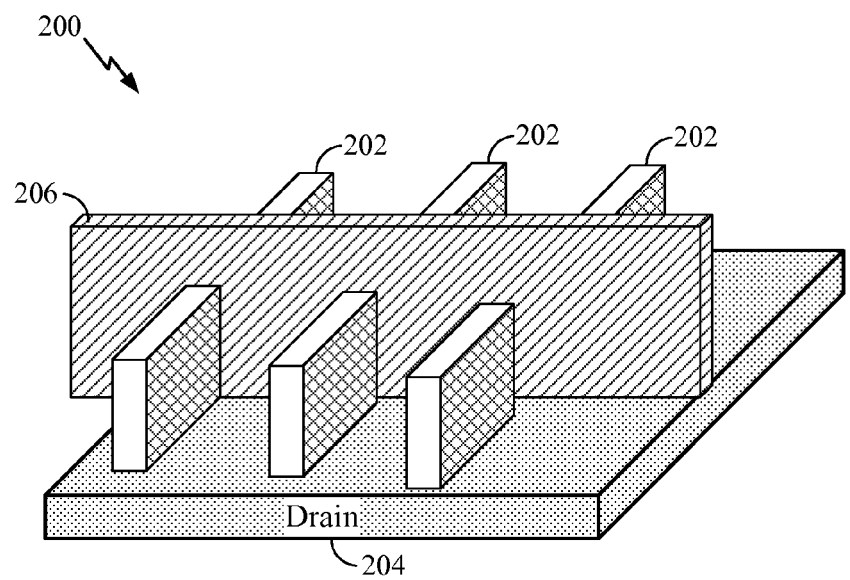
FIG. 2 illustrates a typical capacitor manufactured from a FinFET process flow.

FIG. 2 illustrates a conventional FinFET gate-poly capacitor 200 that is manufactured from a process flow, such as the process flow illustrated in FIG. 1. As illustrated in FIG. 2 the conventional FinFET gate-poly capacitor 200 includes a substrate 204, a gate 206, and fins 202.

Figure 3:
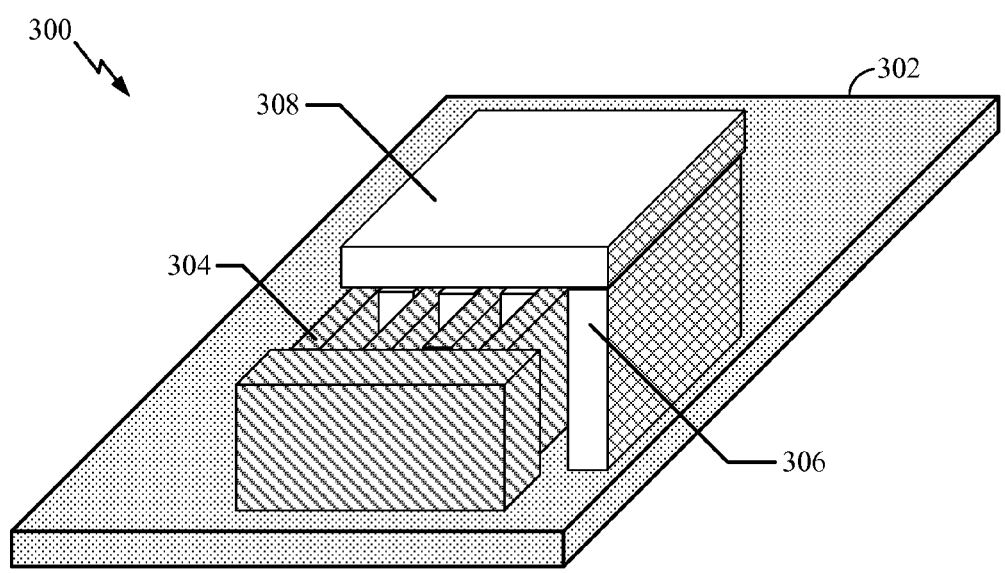
FIG. 3 illustrates a gate-poly capacitor manufactured from a FinFET process flow according to an aspect of the present disclosure.

FIG. 3 illustrates a FinFET gate-poly capacitor 300 according to one aspect of the present disclosure. Representatively, the FinFET gate-poly capacitor 300 includes a semiconductor substrate 302, fins 304 disposed on the surface of the semiconductor substrate 302, and gates 306. As illustrated in FIG. 3, the gates 306 are disposed on the surface of the semiconductor substrate 302 and defined proximate and adjacent to the fins 304. FIG. 3 further illustrates a cap 308 defined on the surface of the fins 304 and the gates 306 to complete the FinFET gate-poly capacitor 300.

In the configuration of FIG. 3, the fins 304 may provide a first terminal of the FinFET gate-poly capacitor 300 and the gates 306 may provide a second terminal of the FinFET gate-poly capacitor 300. According to some aspects, the cap 308 may be a dielectric layer. Furthermore, oxide may be disposed around the fins 304. Moreover, the gates 306 may be a high dielectric constant (K) metal gate that is FinFET compatible. Finally, the channel substrate may be doped to reduce sensitivity.

Figure 4:
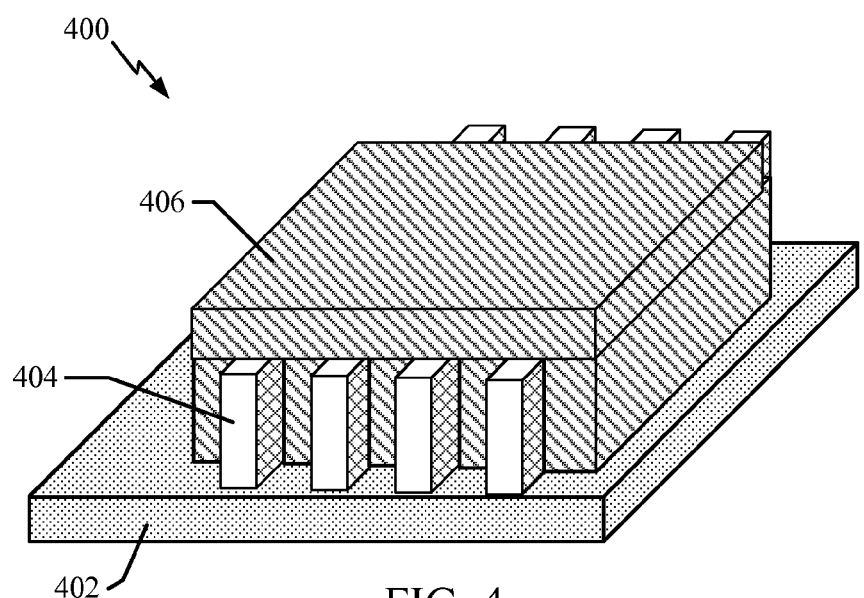
FIG. 4 illustrates a typical capacitor manufactured from a FinFET process flow.

FIG. 4 illustrates a conventional FinFET gate-gate capacitor 400 that is manufactured from a process flow, such as the process flow illustrated in FIG. 1. As illustrated in FIG. 4, the conventional FinFET gate-gate capacitor 400 includes a semiconductor substrate 402, fins 404, and a gate 406. As further illustrated in FIG. 4, the conventional FinFET gate-gate capacitor 400 includes a top gate connection that connects all of the gates 406. It should be noted that the conventional FinFET gate-gate capacitor 400 may also be similar to the conventional FinFET gate-poly capacitor 200 of FIG. 2.

Figure 5:
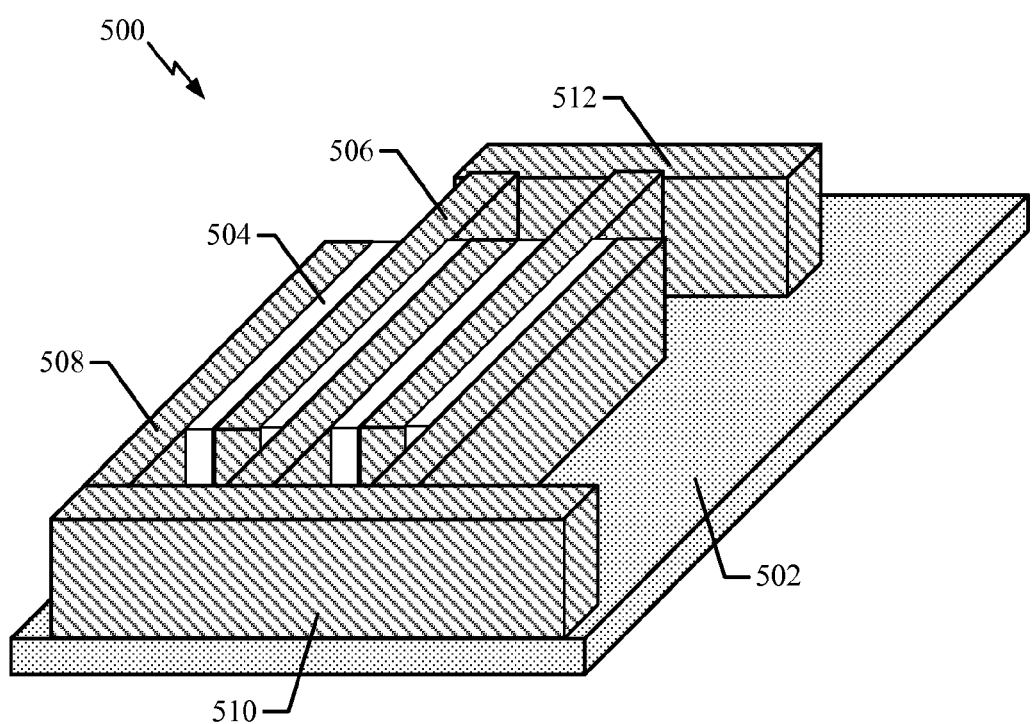
FIG. 5 illustrates a gate-gate capacitor manufactured from a FinFET process flow according to an aspect of the present disclosure.

FIG. 5 illustrates a FinFET gate-gate capacitor 500 according to an aspect of the present disclosure. As illustrated in FIG. 5, the FinFET gate-gate capacitor 500 includes a semiconductor substrate 502, fins 504 disposed on the surface of the semiconductor substrate 502, a first set of gates 506, and a second set of gates 508. According to the configuration of FIG. 5, the FinFET gate-gate capacitor 500 is etched to remove the top gate connection for separate gate control; furthermore, a first cap connection 512 is disposed at the end of the first set of gates 506, and a second cap connection 510 is disposed at the end of the second set of gates 508. In this configuration, the first cap connection 512 and the second cap connection 514 at the ends of the gates 506 and 508, respectively, may operate as capacitor terminals of the FinFET gate-gate capacitor 500. According to some aspects, oxide may be disposed around the fins 504. Additionally, the gates 506 and 508 may be high-K metal gates.

Figure 6:
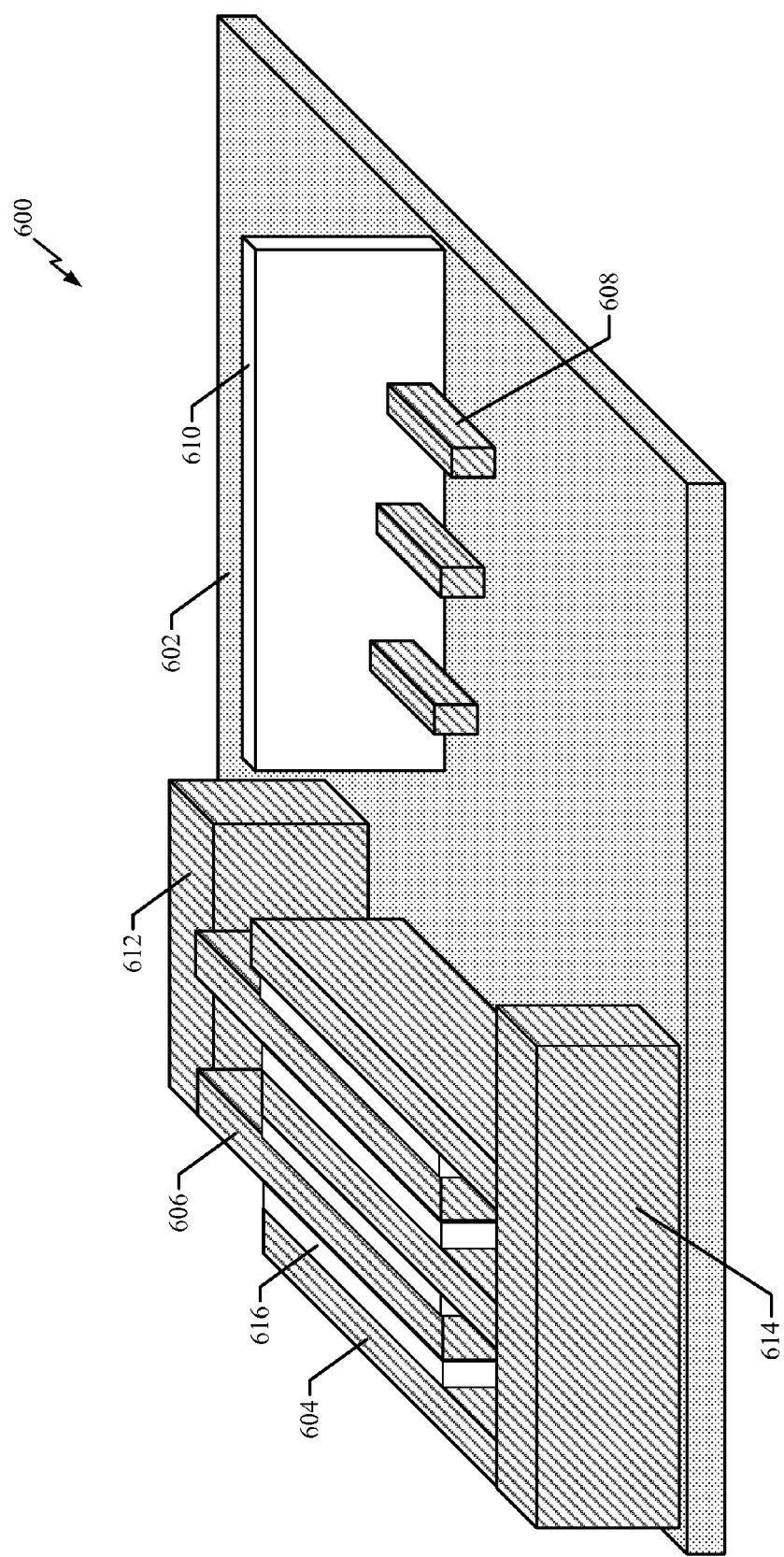
FIG. 6 illustrates a poly-poly capacitor manufactured from a FinFET process flow according to an aspect of the present disclosure.

FIG. 6 illustrates a FinFET poly-poly capacitor 600 according to another aspect of the present disclosure. As illustrated in FIG. 6, the FinFET poly-poly capacitor 600 includes a semiconductor substrate 602, a first set of fins 604 and a second set of fins 606. A third set of fins 608 and a gate 610 may also be provided to fabricate a FinFET transistor. Representatively, dielectric layers 616 are disposed between the first and second set of fins 604 and 606, respectively. In one configuration, a first cap connection 612 is disposed at the end of the first set of fins 604 and a second cap connection 614 is disposed at the end of the second set of fins 606. In this configuration, the ends of the first and second set of fins 604 and 606, respectively, operate as capacitor terminals of the FinFET poly-poly capacitor 600. According to some aspects, oxide may be disposed around the fins 604, 606, 608. Furthermore, the dielectric layer may be silicon nitride. In this configuration, the gate 610 is not part of the capacitor. Rather, a conventional FinFET transistor including the gate 610 and the third set of fins 608 is fabricated on the same substrate 602 as the capacitor, with the same process flow.

It should be noted that various aspects are not limited to the number of gates and fins illustrating the various aspects. The number of gates and fins may be adjusted as appropriate.

Figure 7:
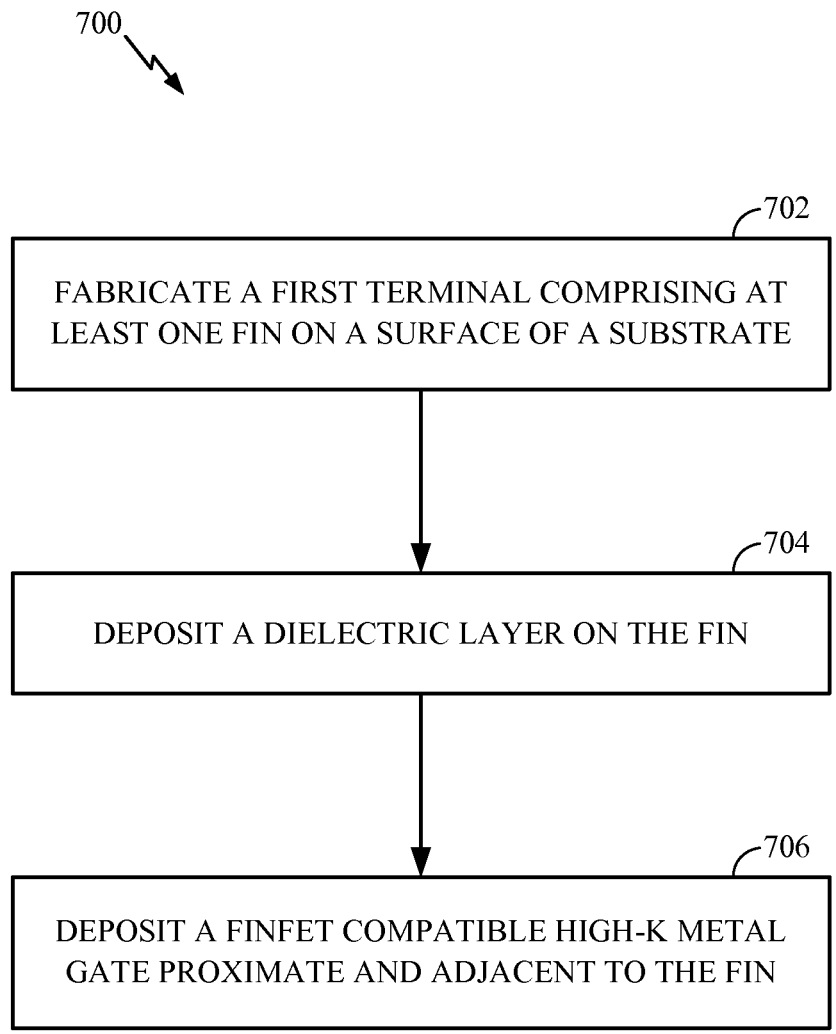
FIGS. 7-9 illustrate methods for manufacturing FinFET capacitor according to various aspects of the present disclosure.

FIG. 7 illustrates a method 700 for manufacturing a FinFET capacitor according to an aspect of the present disclosure. At block 702, a first terminal having at least one fin is fabricated on a surface of a substrate. At block 704, a dielectric layer is deposited on the fin(s). At block 706, a FinFET compatible high-K metal gate is deposited proximate and adjacent to the fin. For example, FIG. 3 shows the gates 306 disposed on the surface of the semiconductor substrate 302 and defined proximate and adjacent to the fins 304. In addition, a cap 308 is defined on the surface of the fins 304 and the gates 306 to complete the FinFET gate-poly capacitor 300. In this configuration, the fins 304 provide a first terminal of the FinFET gate-poly capacitor 300 and the gates 306 may provide a second terminal of the FinFET gate-poly capacitor 300.

Figure 8:
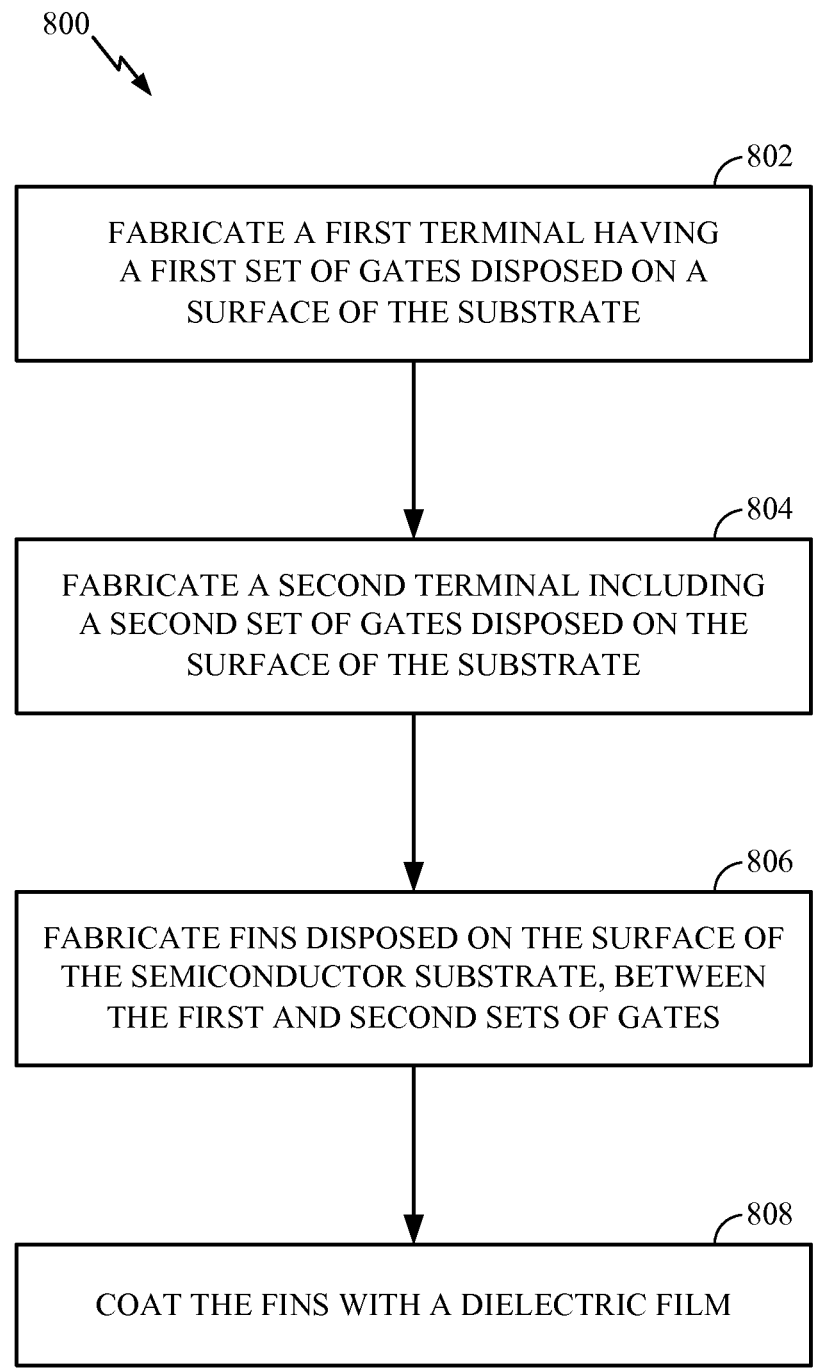

FIG. 8 illustrates a method 800 for manufacturing a FinFET capacitor according to another aspect of the present disclosure. At block 802, a first terminal is fabricated on a surface of a substrate. For example, as shown in FIG. 5, the first terminal includes a first set of gates 506 disposed on a surface of the semiconductor substrate 502. At block 804 a second terminal is fabricating on the surface of the substrate. As shown in FIG. 5, the second terminal includes a second set of gates 508 disposed the surface of the semiconductor substrate 502. At block 806, fins are fabricated on the semiconductor substrate. As shown in FIG. 5, the fins 504 are disposed on the surface of the semiconductor substrate 502, between the first set of gates 506 and the second set of gates 508. As further shown in FIG. 5, a second cap connection 510 is disposed at the end of the second set of gates 508. In this configuration, the first cap connection 512 and the second cap connection 514 at the ends of the gates 506 and 508, respectively, may operate as capacitor terminals of the FinFET gate-gate capacitor 500. At block 808, the fins are coated with a dielectric film, such as an oxide.

Figure 9:
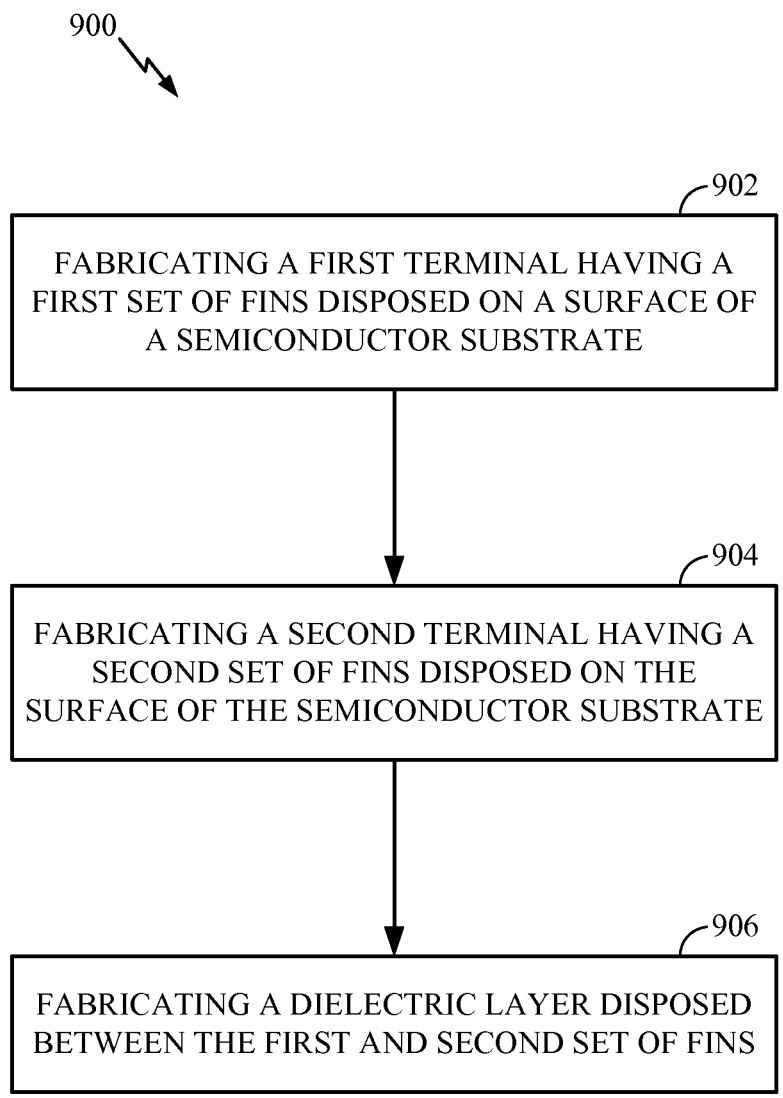

FIG. 9 illustrates a method 900 for manufacturing a FinFET capacitor according to still another aspect of the present disclosure. At block 902, a first terminal is fabricated on a surface of a semiconductor substrate. For example, as shown in FIG. 6, the first terminal includes a first set of fins 604 disposed on the surface of the semiconductor substrate 602. At block 904, a second terminal is fabricated on the surface of the semiconductor substrate. As shown in FIG. 6, the second terminal includes a second set of fins 606 disposed on the surface of the semiconductor substrate 602. At block 906, a dielectric layer, e.g., an oxide, is fabricated.

For example, as shown in FIG. 6, the dielectric layers 616 are disposed between the first set of fins 604 and the second set of fins 606. In this configuration, a first cap connection 612 is disposed at the end of the first set of fins 604 and a second cap connection 614 is disposed at the end of the second set of fins 606. In this configuration, the ends of the first and second set of fins 604 and 606, respectively, operate as capacitor terminals of the FinFET poly-poly capacitor 600.

Figure 10:
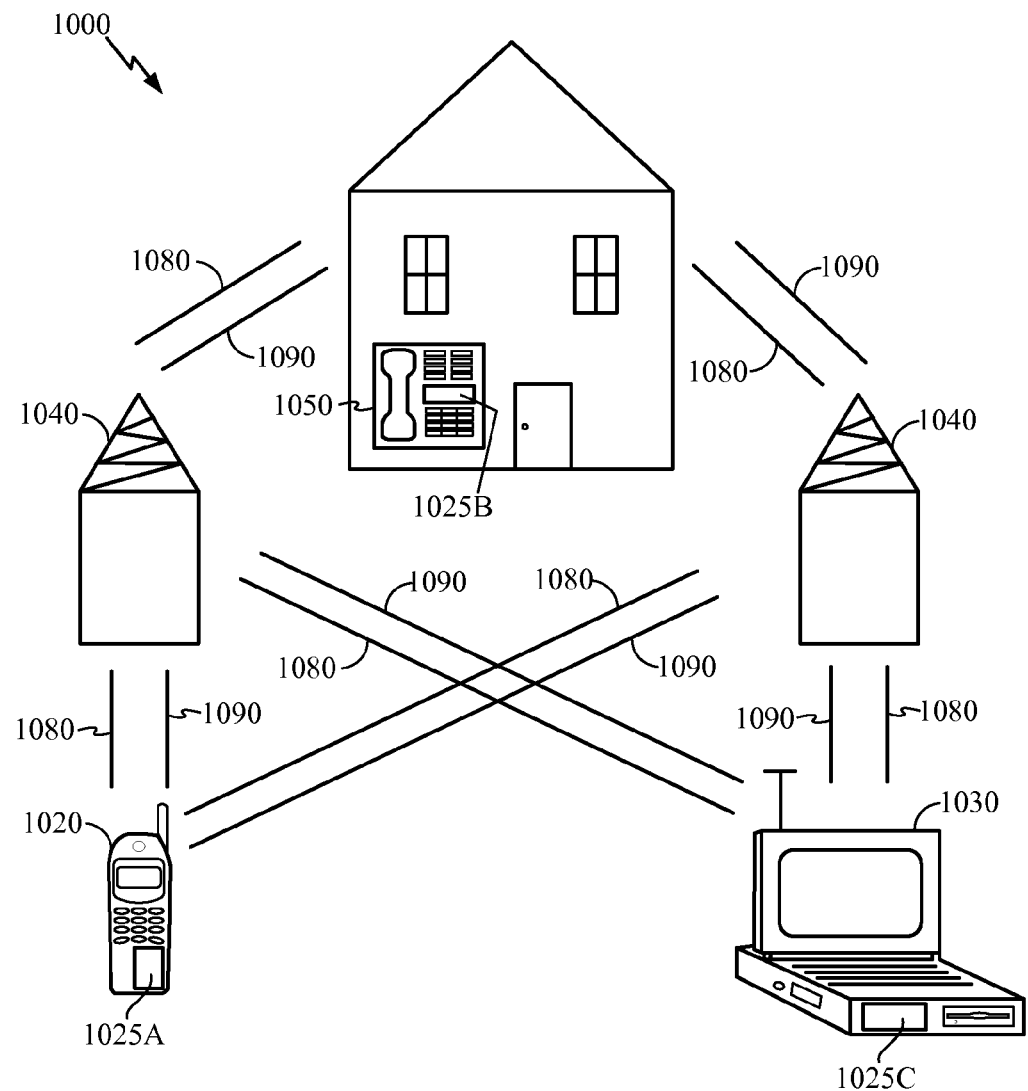
FIG. 10 illustrates an exemplary wireless communication system in which a configuration of the disclosure may be advantageously employed.

FIG. 10 shows an exemplary wireless communication system 1000 in which an aspect of the disclosure may be advantageously employed. For purposes of illustration, FIG. 10 shows three remote units 1020, 1030, and 1050 and two base stations 1040. It will be recognized that wireless communication systems may have many more remote units and base stations. Remote units 1020, 1030, and 1050 include FinFET capacitors 1025A, 1025B, 1025C. FIG. 10 shows forward link signals 1080 from the base stations 1040 and the remote units 1020, 1030, and 1050 and reverse link signals 1090 from the remote units 1020, 1030, and 1050 to base stations 1040.

In FIG. 10, the remote unit 1020 is shown as a mobile telephone, remote unit 1030 is shown as a portable computer, and remote unit 1050 is shown as a fixed location remote unit in a wireless local loop system. For example, the remote units may be cell phones, hand-held personal communication systems (PCS) units, a set top box, a music player, a video player, an entertainment unit, a navigation device, portable data units, such as personal data assistants, or fixed location data units such as meter reading equipment. Although FIG. 10 illustrates remote units, which may employ FinFET capacitors 1025A, 1025B, 1025C according to the teachings of the disclosure, the disclosure is not limited to these exemplary illustrated units. For instance, a FinFET capacitor according to aspects of the present disclosure may be suitably employed in any device.

Figure 11:
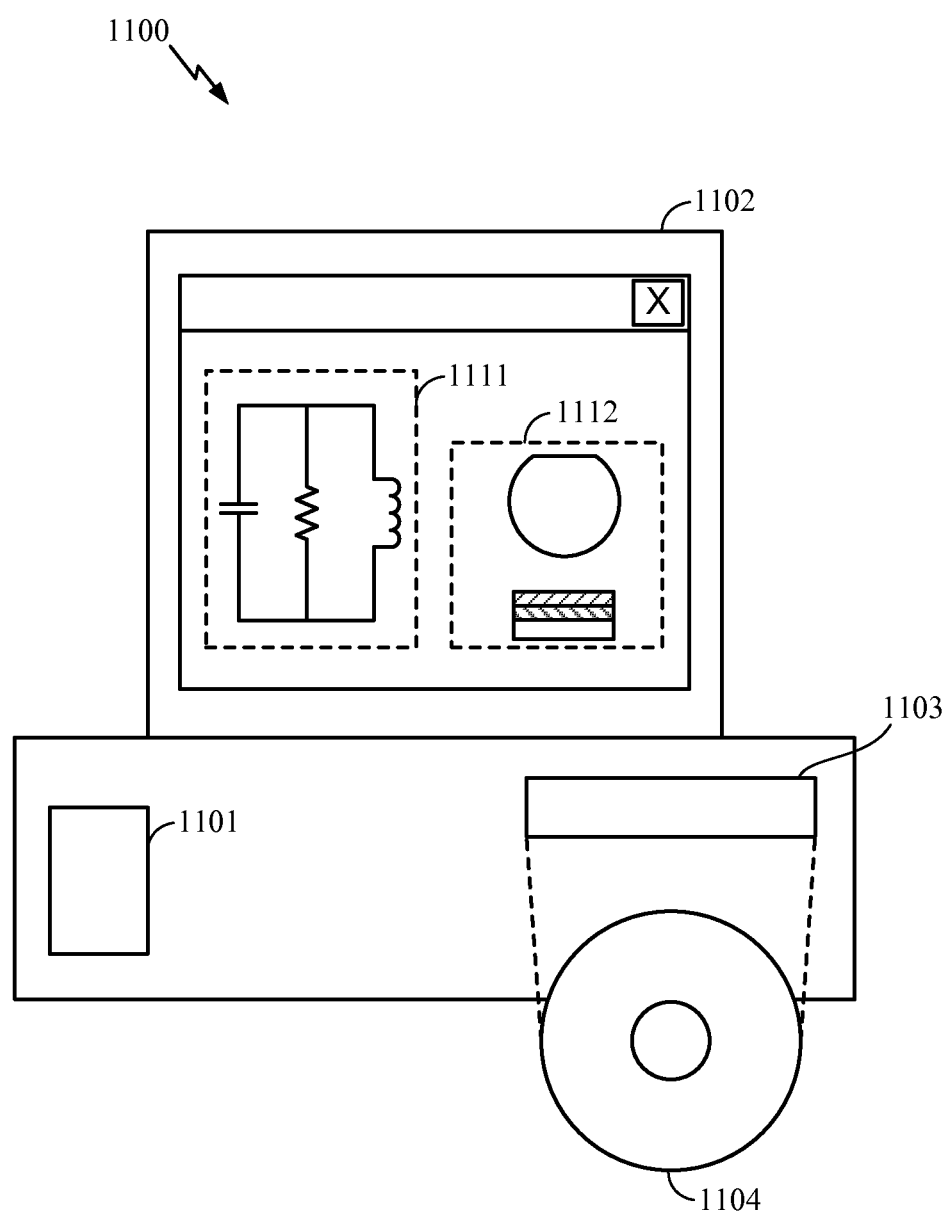
FIG. 11 is a block diagram illustrating a design workstation used for circuit, layout, and logic design of a semiconductor component according to one aspect of the present disclosure.

FIG. 11 is a block diagram illustrating a design workstation used for circuit, layout, and logic design of a semiconductor component, such as a FinFET capacitor disclosed above. A design workstation 1100 includes a hard disk 1101 containing operating system software, support files, and design software such as Cadence or OrCAD. The design workstation 1100 also includes a display 1102 to facilitate design of a circuit 1111 or a semiconductor component 1112 such as a FinFET capacitor. A storage medium 1104 is provided for tangibly storing the circuit design 1111 or the semiconductor component 1112. The circuit design 1111 or the semiconductor component 1112 may be stored on the storage medium 1104 in a file format such as GDSII or GERBER. The storage medium 1104 may be a CD-ROM, DVD, hard disk, flash memory, or other appropriate device. Furthermore, the design workstation 1100 includes a drive apparatus 1103 for accepting input from or writing output to the storage medium 1104.

Data recorded on the storage medium 1104 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1104 facilitates the design of the circuit design 1111 or the semiconductor component 1112 by decreasing the number of processes for designing semiconductor wafers.

In one configuration, a capacitor comprises a supporting means. In one aspect, the supporting means may be a substrate 302, 502, and 602 configured to perform the functions recited by the conducting means. The capacitor is also configured to include a means for insulating. In one aspect, the insulating means may be a dielectric layer configured to perform the functions recited by the insulating means. In another aspect, the aforementioned means may be any module or any apparatus configured to perform the functions recited by the aforementioned means.

In another configuration, the aforementioned means may be any module or any apparatus configured to perform the functions recited by the aforementioned means. Although specific means have been set forth, it will be appreciated by those skilled in the art that not all of the disclosed means are required to practice the disclosed configurations. Moreover, certain well known means have not been described, to maintain focus on the disclosure.

The methodologies described herein may be implemented by various means depending upon the application. For example, these methodologies may be implemented in hardware, firmware, software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine or computer readable medium tangibly embodying instructions may be used in implementing the methodologies described herein. For example, software code may be stored in a memory and executed by a processor. When executed by the processor, the executing software code generates the operational environment that implements the various methodologies and functionalities of the different aspects of the teachings presented herein. Memory may be implemented within the processor or external to the processor. As used herein, the term "memory" refers to any type of long term, short term, volatile, nonvolatile, or other memory and is not to be limited to any particular type of memory or number of memories, or type of media upon which memory is stored.

The machine or computer readable medium that stores the software code defining the methodologies and functions described herein includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. As used herein, disk and/or disc includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present teachings and their advantages have been described in detail, it should be understood that various changes, substitutions and alterations can be made herein without departing from the technology of the teachings as defined by the appended claims. Moreover, the scope of the present application is not intended to be limited to the particular aspects of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding aspects described herein may be utilized according to the present teachings. Accordingly, the appended claims are intended to include within their scope such processes, machines, manufacture, compositions of matter, means, methods, or steps.

What is claimed is:

1. A capacitor comprising:
   a first capacitor terminal;
   a first plurality of gates disposed on a surface of a semiconductor substrate and coupled to the first capacitor terminal;
   a second capacitor terminal;
   a second plurality of gates disposed on the surface of the semiconductor substrate and coupled to the second capacitor terminal, a portion of the second plurality of gates overlapping with a portion of the first plurality of gates; and
   a plurality of fins coated with a dielectric film and disposed on the surface of the semiconductor substrate and arranged side by side, between the first and second plurality of gates, in an overlapping area, the first plurality of gates and the second plurality of gates having an exposed surface opposite the surface of the substrate at least in the overlapping area and separate from an exposed dielectric surface of the plurality of fins opposite the surface of the substrate.

2. The capacitor of claim 1, in which at least one of the first plurality of gates and at least one of the second plurality of gates is coplanar with at least one of the plurality of fins.

3. The capacitor of claim 1, in which the semiconductor substrate is substantially uniformly doped.

4. The capacitor of claim 1, in which at least one of the plurality of fins is doped to reduce a sensitivity of a channel in the semiconductor substrate.

5. The capacitor of claim 1, in which the first terminal and the second terminal are coplanar with at least one of the first plurality of gates and at least one of the second plurality of gates.

6. The capacitor of claim 1, further comprising an oxide disposed on at least one of the plurality of fins.

7. The capacitor of claim 1, in which the first terminal is coupled to a first end of the first plurality of gates and the second terminal is coupled to a second end of the second plurality of gates opposite the first terminal.

8. The capacitor of claim 1, in which at least one of the first plurality of gates and at least one of the second plurality of gates comprises a high-K metal gate (HKMG).

9. The capacitor of claim 1, integrated in a mobile phone, a set top box, a music player, a video player, an entertainment unit, a navigation device, a computer, a hand-held personal communication systems (PCS) unit, a portable data unit, and/or a fixed location data unit.

10. A capacitor comprising:
a first capacitor terminal;
a first plurality of fins disposed on a surface of the semiconductor substrate and coupled to the first capacitor terminal;
a second capacitor terminal;
a second plurality of fins disposed on the surface of the semiconductor substrate and coupled to the second capacitor terminal, a portion of the second plurality of fins overlapping with a portion of the first plurality of fins; and
a dielectric layer between the first plurality of fins and the second plurality of fins and arranged side by side in an overlapping area, the first plurality of fins and the second plurality of fins having an exposed surface opposite the surface of the substrate and separate from the dielectric layer at least in the overlapping area.

11. The capacitor of claim 10, in which at least one of the first plurality of fins is coplanar with at least one of the second plurality of fins.

12. The capacitor of claim 10, in which at least one of the first plurality of fins and at least one of the second plurality of fins is doped to reduce a sensitivity of a channel in the semiconductor substrate.

13. The capacitor of claim 10, in which the first terminal and the second terminal are coplanar with at least one of the first plurality of fins and at least one of the second plurality of fins.

14. The capacitor of claim 10, further comprising an oxide disposed on at least one of the first plurality of fins and at least one of the second plurality of fins.

15. The capacitor of claim 10, in which the first terminal is coupled to a first end of the first plurality of fins and the second terminal is coupled to a second end of the second plurality of fins opposite the first terminal.

16. The capacitor of claim 10, in which the dielectric layer comprises silicon nitride.

17. The capacitor of claim 10, integrated in a mobile phone, a set top box, a music player, a video player, an entertainment unit, a navigation device, a computer, a hand-held personal communication systems (PCS) unit, a portable data unit, and/or a fixed location data unit.

18. A capacitor comprising:
a first capacitor terminal;
a first plurality of fins, disposed on a surface of a substrate and coupled to the first capacitor terminal;
a second capacitor terminal;
a second plurality of fins disposed on the surface of the substrate and coupled to the second capacitor terminal, the second plurality of fins being coplanar and interleaved with the first plurality of fins, a portion of the second plurality of fins overlapping with a portion of the first plurality of fins; and
means for insulating between the first plurality of fins and the second plurality of fins and arranged side by side in an overlapping area, the first plurality of fins and the second plurality of fins having an exposed surface opposite the surface of the substrate and separate from the insulating means at least in the overlapping area.

19. The capacitor of claim 18 in which the means for insulating comprises silicon nitride.

20. The capacitor of claim 18, in which the semiconductor substrate is substantially uniformly doped.

21. The capacitor of claim 18, further comprising an oxide disposed around at least one of the first plurality of fins and at least one of the second plurality of fins.

22. The capacitor of claim 18, integrated in a mobile phone, a set top box, a music player, a video player, an entertainment unit, a navigation device, a computer, a hand-held personal communication systems (PCS) unit, a portable data unit, and/or a fixed location data unit.

23. The capacitor of claim 18, further comprising a FinFET capacitor including a third plurality of fins and gate coupled to the third plurality of fins.

* * * * *